(12) United States Patent
Audette et al.

(10) Patent No.: US 6,720,789 B1
(45) Date of Patent: Apr. 13, 2004

(54) METHOD FOR WAFER TEST AND WAFER TEST SYSTEM FOR IMPLEMENTING THE METHOD

(75) Inventors: David M. Audette, Colchester, VT (US); David L. Gardell, Fairfax, VT (US); John F. Hagios, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 10/366,157

(22) Filed: Feb. 13, 2003

(51) Int. Cl.$^7$ .............................................. G01R 31/02
(52) U.S. Cl. ..................... 324/765; 324/754; 324/158.1
(58) Field of Search .............................. 324/765, 754, 324/758, 158.1, 757, 72.5; 714/724, 719

(56) References Cited

U.S. PATENT DOCUMENTS

| | | | |
|---|---|---|---|
| 4,195,259 A | | 3/1980 | Reid et al. |
| 4,673,839 A | | 6/1987 | Veenendaal |
| 5,850,146 A | | 12/1998 | Shim et al. |
| 6,043,668 A | * | 3/2000 | Carney .................... 324/758 |
| 6,111,419 A | * | 8/2000 | Lefever et al. ............. 324/754 |
| 6,127,831 A | | 10/2000 | Khoury et al. |
| 6,137,299 A | | 10/2000 | Cadieux et al. |
| 6,476,626 B2 | * | 11/2002 | Aldaz et al. ................ 324/757 |

* cited by examiner

Primary Examiner—Kamand Cuneo
Assistant Examiner—Jimmy Nguyen
(74) Attorney, Agent, or Firm—Scully, Scott, Murphy & Presser; Robert A. Walsh, Esq.

(57) ABSTRACT

A method and system for testing wafers, and particularly a wafer test system employing probes to provide for electrical contact with a device under test (DUT) which is located on a wafer. More particularly, also provided is a method and system for implementing wafer tests where the probes first contact a simulated wafer which incorporates an array of spaced load cells to determine the optimum probe overdrive. The DUT is then tested at the optimum overdrive.

17 Claims, 6 Drawing Sheets

Location of Measured Probe Force Centroid
As Chuck drives from 0 to 11 (57 pounds maximum)

METHOD FOR WAFER TEST AND WAFER TEST SYSTEM FOR IMPLEMENTING THE METHOD

BACKGROUND OF THE INVENTION

1. Field of the Invention

The present invention relates to a method for testing wafers, and particularly pertains to a wafer test system employing probes to provide for electrical contact with a device under test (DUT) which is located on a wafer. More particularly, the invention is also directed to providing an improved method for implementing wafer tests where the probe force is first characterized by contacting a simulated wafer before contacting the DUT. The simulated wafer incorporates an array of load cells, which measure probe force and planarity of the probe array to the DUT.

Basically, in order to provide appropriately reliable electrical contact with a device under test (DUT, such as electrical circuitry on a wafer having such integrated circuits (IC) located thereon), numerous and diverse types of probes have been developed in the technology, wherein it is normally recognized that each probe type necessitate the employment of a specific probing force. A prober system, for example, such as Tokyo Electron LTD. (TEL) model P12 XL of Japan moves a wafer into precision alignment with an array of probes in order to facilitate contact to the DUT. An insufficient contact force will result in an unreliable electrical contact while an excessive contact force will result in damage to the probes or contact pads on the DUT. Modern probe arrays may incorporate hundreds or thousands of probes to simultaneously contact the corresponding pads on the DUT or array of DUTs. Currently, most methods and arrangements or systems which are employed for wafer testing do not incorporate sufficiently reliable structure or testing steps which will readily or accurately determine the probe force that is being applied to each pad on the DUT during implementation of the testing procedure.

Each probe technology has a characteristic probe compliance or spring rate, thus the correct probe force occurs at a specific probe displacement. Consequently, the current wafer testing practice is to overdrive or displace the wafer the specified distance into the probe system. Unfortunately the resulting forces may result in significant deflection of the probe support structure. This is especially a problem with probe arrays that incorporate a large number of probes; in this case the amount of overdrive must be increased to over come deflection of the support structure. The actual amount of the resultant force is not readily determinable and may be open to conjecture. Thus, a typical overdrive is ordinarily determined experimentally for one particular product, and through extrapolation or assumptions employed for all similar systems and products.

Each product that is tested in a factory will generally have a different number of probes in the array pattern. The probe arrays have a limited life and are replaced regularly as they become worn or damaged. The cost of replacement probe arrays is significant.

If the plane defined by the probe tips is not parallel to the plane of the DUT, some probes will contact the DUT before others, resulting in an application of excessive force on some probes and insufficient force on other probes, even though the total force is correct. Currently available systems can optically measure probe tip planarity only when no load is applied. However, as the support structure deflects, the planarity may further degrade. Thus, it is desirable to measure the total probe force and the planarity of the probe array under the conditions of full overdrive (maximum force). Also, wafer chuck deflection may be different at different locations on the chuck in response to high probe loads. It is thus desirable to be able to measure force and planarity at various locations on the chuck as a function of overdrive.

At this time, several factors are known which affect actual probe force and probe planarity when there is utilized a constant overdrive for the wafer. Thus, this in essence, pertains to the number of probes, types of probes, the stiffness of the wafer chuck which displaces the wafer towards the probe system, the type and stiffness of the device interface board (DIB) that the probes are attached to, the type of tester, the type of probe ring carriers, and the head plate of the equipment being used to effectuate wafer testing. In effect, for each probe set used in manufacturing there is consequently desired to provide for a particular probe overdrive which will result in an optimum force and electrical contact with the electrical circuitry on the wafer, and which will also provide for probe reliability, an extended probe service life and a high product yield evident of an efficient wafer testing procedure.

2. Discussion of the Prior Art

Pursuant to the present state of the technology, there have been developed and placed in use numerous devices for testing wafers and integrated circuits on printed circuit board assemblies.

Reid, et al. U.S. Pat. No. 4,195,259 discloses a probe system and method of using the latter, wherein a plurality of the probes in the array are modified to measure force and probe array planarity. This suffers the disadvantage of adding significant cost and complexity to every probe array that is used in the test operation. It is only applicable to one probe type and it does not measure total probe load.

Veenendaal U.S. Pat. No. 4,673,839 provides a piezoelectric pressure sensing apparatus which measures the total force applied to the probe array. It is only applicable to membrane probes and is an added cost to each probe structure. It measures only the total force, not probe planarity.

Shim, et al. U.S. Pat. No. 5,850,146 also discloses a probe apparatus with integrated force sensor, which is impractical for arrays of large numbers of probes.

Cadieux, et al. U.S. Pat. No. 6,137,299 also discloses a load sensing means integrated into the probe array. It is particularly well suited to testing of known good die. It is not applicable to all probe types.

Khoury, et al. U.S. Pat. No. 6,127,831 discloses a method for the testing of semi-conductor devices, in which probe force is measured as a function of overdrive with a load cell permanently mounted on the side of the wafer support chuck. Testing of the DUT commences only if the probes are within specification. A limitation is that load cells are generally most accurate only under a limited range of forces. If a load cell is designed to measure 50 lb from an array of 2000 probes it will not provide accurate results at 2 lb on an array of 50 probes. An apparatus such as disclosed by Khoury will provide accurate force measurement of an array of probes only if the resultant probe force is perfectly centered over the single load cell. Any off centered force will result in undesirable sideways loads or friction. An additional limitation is that Khoury provides no measure of the degree to which the load is off centered or the probes are not planar.

The inventors have recognized structures from a different field can be improved upon and applied to the field of wafer test. Roeber, U.S. Pat. No. 4,121,049, Peronneau et al. U.S. Pat. No 3,657,475 and a co-pending application by Gardell et al. describe a rigid plate supported by a plurality of load sensors. The location of an external load which is applied to the top of the plate can be accurately determined from the output of load cells and their locations.

SUMMARY OF THE INVENTION

Accordingly, in order to provide an improved and novel method of testing wafers with regard to the integrity of electrical circuitry or operative components mounted or arranged thereon, through the implementing of an electrical contact effected through probes with the device under test (DUT), in effect, on the wafer, and also to test the planarity thereof, there is provided an integration of force measurement into the probe system.

Pursuant to the invention, there is provided a simulated wafer wherein a rigid load plate is supported by a plurality of load cells. The load cells are located on a support plate. A retainer attached to the support plate loosely retains the load plate above the support plate and load cells. The simulated wafer is located on the wafer chuck and the chuck is moved upward until the probe array contacts the top of the load plate. The resulting probe load is thus transferred to and measured by the load cells. An advantage of the current invention is that only the load cells support the entire load, there is negligible friction or other support even if the resultant probe load is not perfectly centered. Also only the output force is read directly from each load cell, no additional calibration of the load cells is required.

Since different products have widely differing force requirements and inline tests or memory chips may provide for a total probe force of less than one pound, whereas a fully populated larger product may have a total probe force of over 100 pounds, nevertheless they may be tested on the same chuck. Although it is difficult to design a single force measurement system which is operated under such a wide range of forces. An advantage of the current invention is that several different simulated wafers can be constructed, each using load cells optimized for a specific range of forces.

Moreover, adding a force measurement system to a DIB would be expensive since numerous DIB's are encountered on site, and contrary to current practice, this aspect is obviated by the novel features of the present invention. In one embodiment of the invention the simulated wafer is portable and can be used in several different prober systems, thus it is not necessary to modify each prober on the site.

Another aspect which is advantageously attained by means of the present invention resides in that it is possible to measure probe planarity over a wide range of probe forces by incorporating three or more suitably spaced load cells into the simulated wafer. In essence, if the load cells are equally spaced and distributed about the center of the probe array, an equal force acting on each load cell would be expected, whereby in the event that one load cell reads higher, it is thus known that the probes on that side of the probe array must be generating a higher force and a non-planar probe set can be suspected. In actual practice, with the appropriate calculations, the load cells do not need to be equally spaced. Additionally the calculations can predict the overtravel that will result in all probes making contact even if the array is not planar to the DUT.

Yet another aspect is that the simulated wafer can be small and moved to various locations on the wafer chuck to determine if chuck planarity and force changes as a function of location on the chuck. For example by local deflections of the chuck at high probe loads. Also it can be mounted to the side of the chuck. Another aspect is that the support plate can be made to approximate the size of the wafers to be tested, the load cells and load plate are located at specific points on the support plate.

Another aspect of the invention is that it can be optimized to work with a particular probe and DUT type. Common probes have a significant deflection of several mils or more at the recommended force, the DUT has a relatively hard metal pad, typically of aluminum, with negligible deflection. For this case the simulated wafer will be designed so the load plate maintains planarity and has minimal deflection, for example by spacing the load cells apart and using load cells with minimal deflection. In contrast to the forgoing, some types of DUTS have compliant pads such as solder balls and are tested with rigid probe systems. In this case it will be advantageous to design a simulated wafer that allows the load plate to tilt and conform to the planarity of the rigid probe array and has compliance similar to the solder balls. This can be advantageously achieved by spacing the load cells close together and recognizing the output of each load cell is proportional to its displacement. Thus from the geometry, the tilt of the load plate is calculated and the resulting deflection of each solder ball is determined.

BRIEF DESCRIPTION OF THE ACCOMPANYING DRAWINGS

Reference may now be made to the following detailed description of a preferred embodiment of the invention, taken in conjunction with accompanying drawings; in which.

DETAILED DESCRIPTION OF PREFERRED EMBODIMENTS

Figure 1:
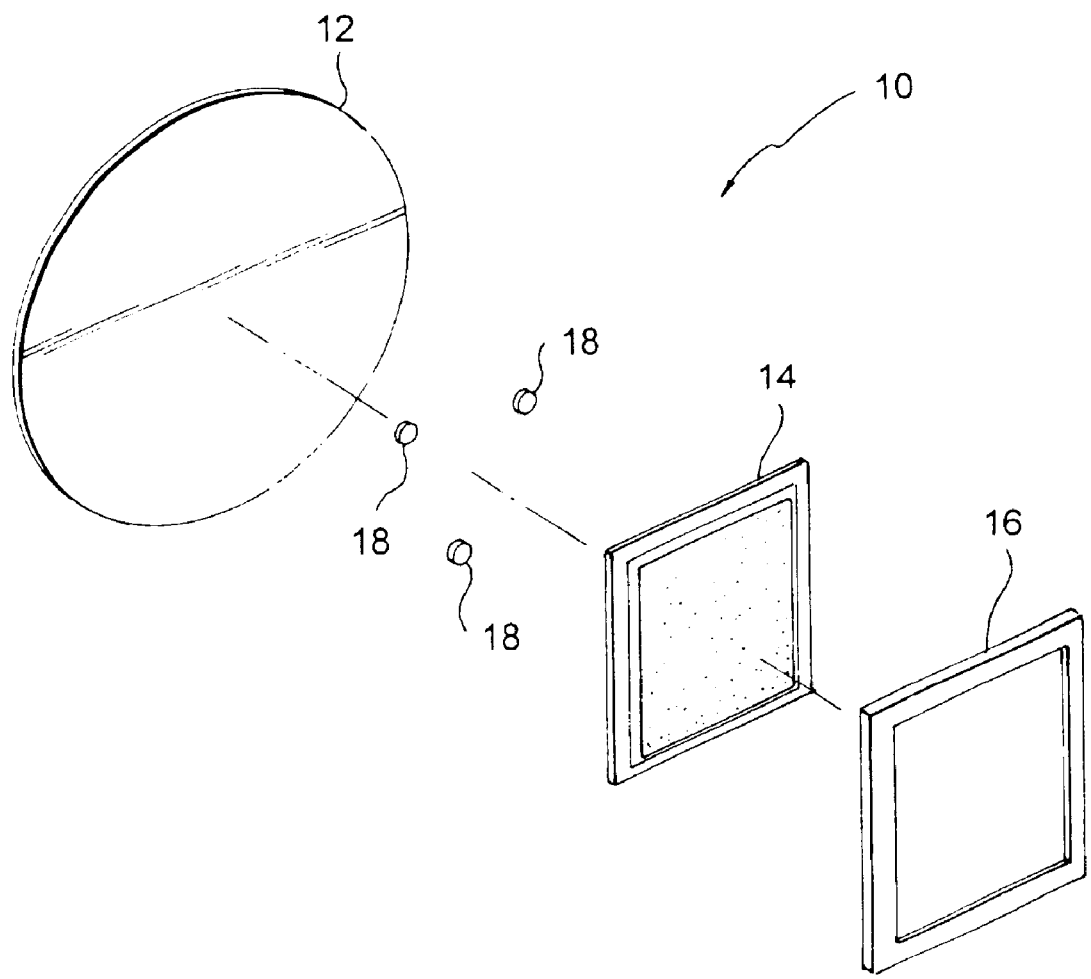
FIG. 1 illustrates an exploded perspective view of a simulated wafer construction pursuant to the invention.

Referring now to FIG. 1 of the drawings, there is illustrated a simulated wafer construction 10, which comprises a support plate 12 constituted of generally rigid material.

Arranged on the support plate 12 are three (3) load cells 18 which, in turn, support a load plate 14 of generally preferably rectangular construction, although other configurations can also be employed. A retainer frame 16 is attached to support plate 12 with a number of screws (not shown) and surrounds load plate 14. In the enlarged view of FIG. 3A, there is depicted the provision of a small gap between the load plate 14 and retainer 16 that allows the load plate to move freely within the retainer. The load cells 18 fit into shallow pockets formed in the support plate so that their positions are fixed. Interposed between the load plate 14 and the support plate 12, the three cells 18 are shown positioned in spaced relationship about a center for purposes of determining the planarity of the arrangement, as described further on hereinbelow.

Figure 2:
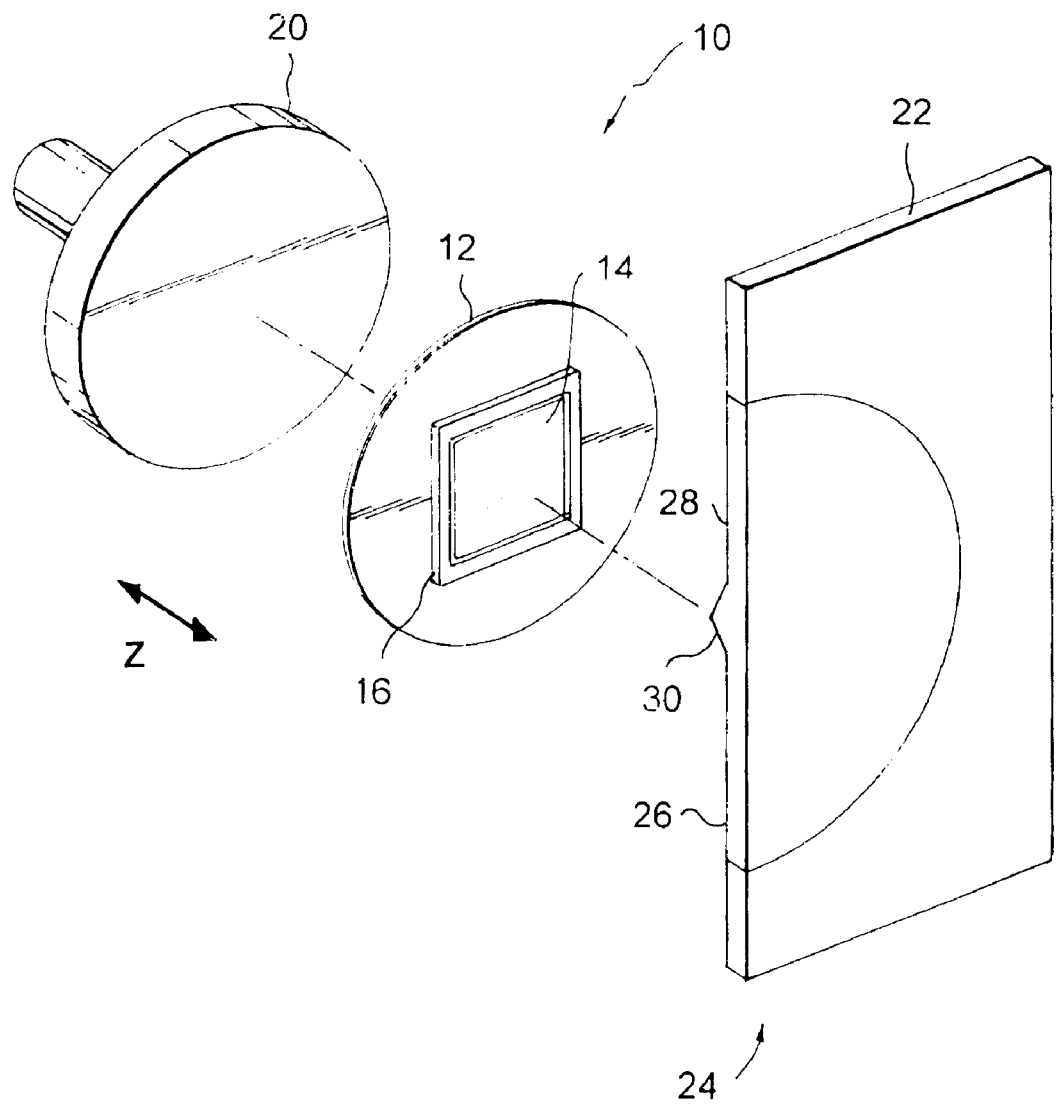
FIG. 2 illustrates a perspective exploded view of a wafer probe arrangement showing the assembled simulated wafer in position prior to being tested, contacted by the probe or probes.

The simulated wafer 10 as illustrated in the exploded perspective view of FIG. 2, wherein it is shown in an assembled condition, in furtherance of the exploded representation of FIG. 1, is adapted to have the support plate 12 with the remaining wafer components 14, 16 and 18 positioned on a wafer chuck 20, the latter of which is adapted to be reciprocated in a Z-direction towards and away from a probe head plate 22 of a wafer prober system 24. Mounted in a central cutout in the wafer probe head plate 22, in a similar configuration as is the periphery of the simulated wafer 10 and wafer chuck 20, is a device interface board (DIB) 26 which is comprised of an essentially rigid dielectric material, which on a surface 28 thereof facing towards the simulated wafer 10 includes a probe array 30 which is connected to an electrical test system (not shown). The probe or probes 30 face the load plate 14 beneath which the load cells 18 are arranged to measure the total probe force and the centroid of the force as a function of the Z overtravel.

Preferably the prober system will align the probe array to the center of the load plate 14. The location of each load cell 18 is known with respect to the center of load plate 14. Thus the location of each probe and the load cells can be determined relative to any convenient common coordinate system. For example, the X and Y-axis may pass .thru the probes on two adjacent edges of the array with the origin being at a corner probe. The total probe force is obviously the sum of the forces from the three load cells. It is also known that application of the principle of summation of moments about the X and Y axis will resolve the location of the centroid of the probe force. The centroid is a mathematically determined coordinate point at which an equivalent load can be applied and will result in exactly the same reading on the 3 load cells as the array of probes. It is recognized that if the measured centroid is near the center of a uniform array of probes then all probes will have the same force. Conversely, if the centroid is near one corner of the array then the probes in that corner are applying higher force then the probes in the opposite corner.

In a preferred embodiment of the invention, the optimal location of the load cells 18 is determined by the type of probe and size of the array. For a compliant probe, the triangle defined by the load cell locations will preferably encompass the entire probe array. Three load cells is the minimum but it may be advantageous to use more sensors, load cells or strain gages, such as one just outside each corner of the probe array. Spaced apart load cells ensure minimum change in planarity of the load plate in response to an off centered load. In contrast, for a rigid probe system the load cells are generally spaced close together, which will allow the load plate to tilt and conform to the planarity of the probes. For all cases, the calculated data may be valid only if there is a reading on at least three load cells.

In another embodiment, an additional layer (not shown) may be added to the surface of the load plate 14. For example, the layer may simulate the hardness or conductivity of the DUT pads or the layer may be designed to clean or planarize the probes.

In lieu of the provision of load cells 18 for measuring probe force, it is also possible to utilize other types of electrical measuring devices, such as strain gauges or the like. Other suitable means can also be used to locate the load cells and retain the load plate.

As previously indicated, there is employed a plurality, preferably three or more load cells 18, three being represented in FIG. 1, which are incorporated into the simulated wafer 10, and which are located beneath the load plate 14 which is adapted to be contacted by the probe or probes 30.

Figure 3:
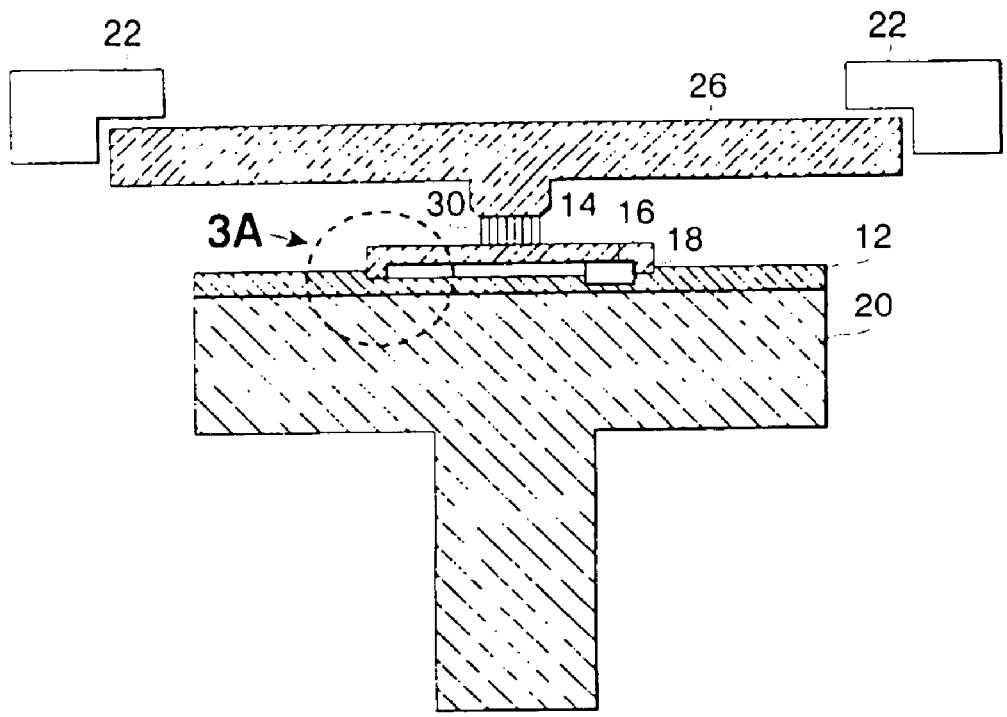
FIG. 3 illustrates a side view, partly in section and on an enlarged scale, of the arrangement of FIG. 2 showing the wafer prober in contact with the simulated wafer.
Figure 3A:
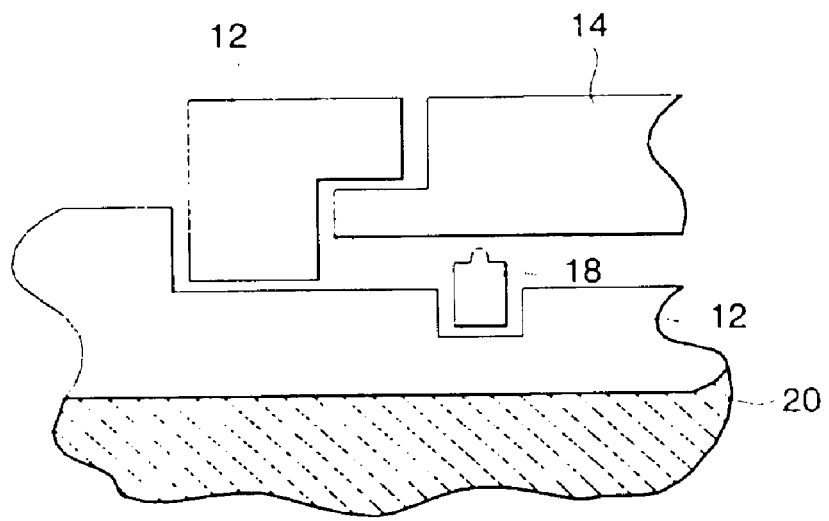
FIG. 3A illustrates an enlarged view of a portion of the simulated wafer outlined in the broken circle of FIG. 3.

As indicated in FIG. 3 of the drawings, which is a cross-sectional enlarged sectional view of the wafer probe system as represented in FIG. 2, this shows the wafer chuck 20 being forced upwardly in its Z-direction so as to cause the probe or probes 30 to contact the metal load plate 14 beneath which the load cells 18 are arranged on the support plate 12 of the simulated wafer structure 10.

Figure 4:
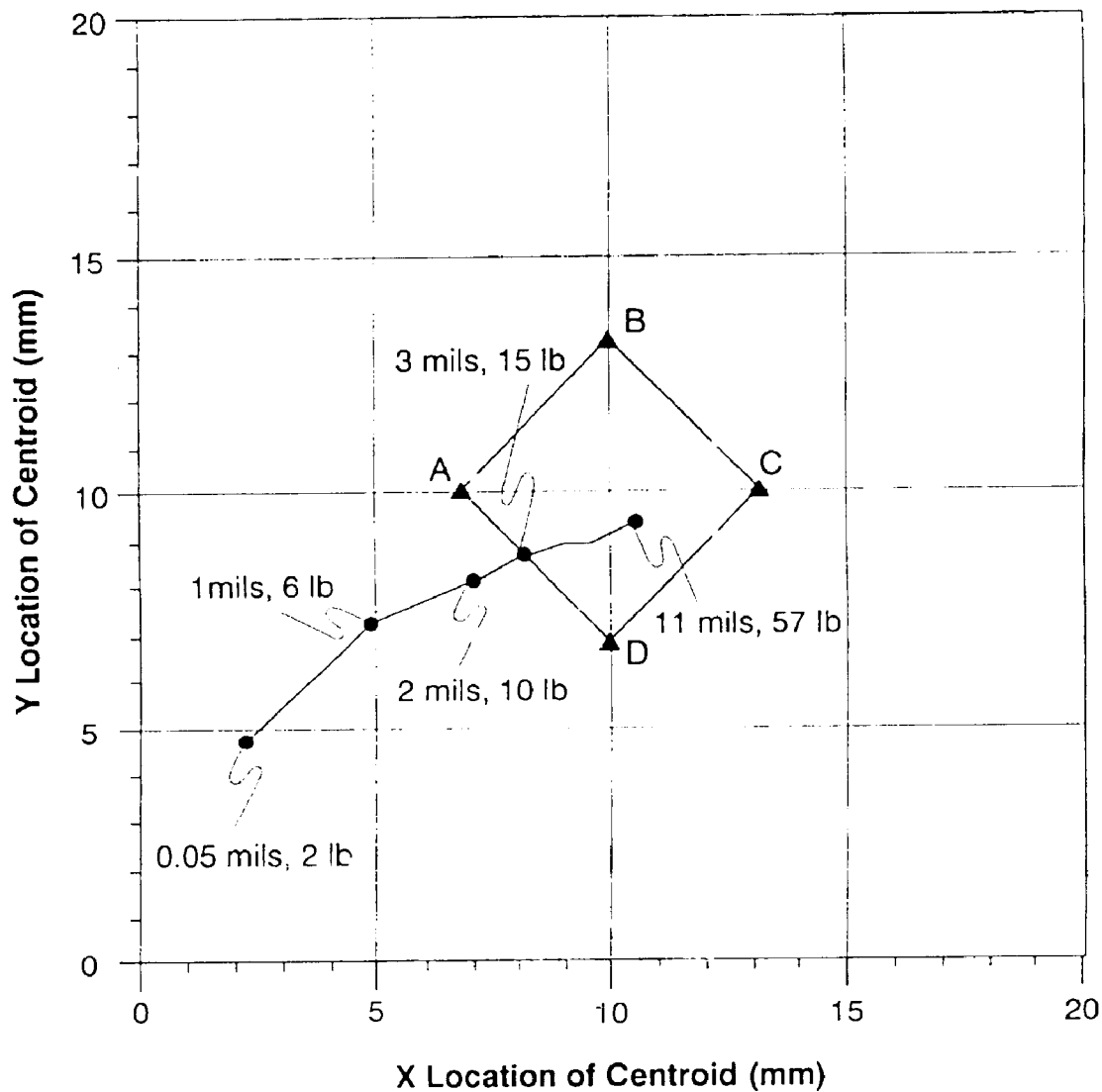
FIG. 4 illustrates a graphical representation of wafer test experimental data.

Referring to the graphical representations of FIG. 4, there are indicated various aspects relative to the unique accuracy obtained by the present wafer probe or test system.

Thus, in FIG. 4 there are illustrated results from measurements on a typical 20 mm square compliant probe array as the wafer chuck 20 travel Z increases from 0 to 11 mils corresponding to a total force of from 0 to 57 lb. One corner of the probe array 30 is at the origin of the coordinate system (X,Y) of (0,0). As is often the case in a manufacturing environment, the probe array is not perfectly planar to the simulated wafer 10. Therefore as the simulated wafer is moved up into the probes 30, initially only the probes in the lower left corner make contact to the simulated wafer 10. Thus the centroid of force is at the lower left corner. As the wafer continues to move upward, more probes make contact and the centroid of force moves towards the center of the probe array. There will be a point where the last probe 30 makes initial contact with the simulated wafer 10. This will occur when the force centroid is on the square area marked A-B-C-D. Any travel beyond this point will apply load to all probes simultaneously and will eventually result in reaching the required minimum force on the last probe contacted (probe with the least amount of deflection). Overtravel is defined as the amount of total chuck travel from first probe contact to the final position that results in the required minimum force on all probes.

The location of point A can be determined by recognizing that when the centroid is at that point the probes at X=0 are at maximum deflection and the probes at X=20 are just making contact (zero deflection). In a uniform array of probes, 20 mm square, A is located at X=6.67 mm, or ⅓ of the way from the maximum force probe to the zero force probe.

The calculations for compliant probes are demonstrated by assuming all, probe tips initially lie in essentially the same plane, said plane not necessarily being initially parallel to the DUT or simulated wafer and that each probe in the array has a known and constant spring rate (probe compliance). The initial angles between the two planes, measured with respect to the X and Y axis, before contact will be related to the deflection each probe sees after contact. This assumes negligible movement of the chuck and DIB.

Figure 6:
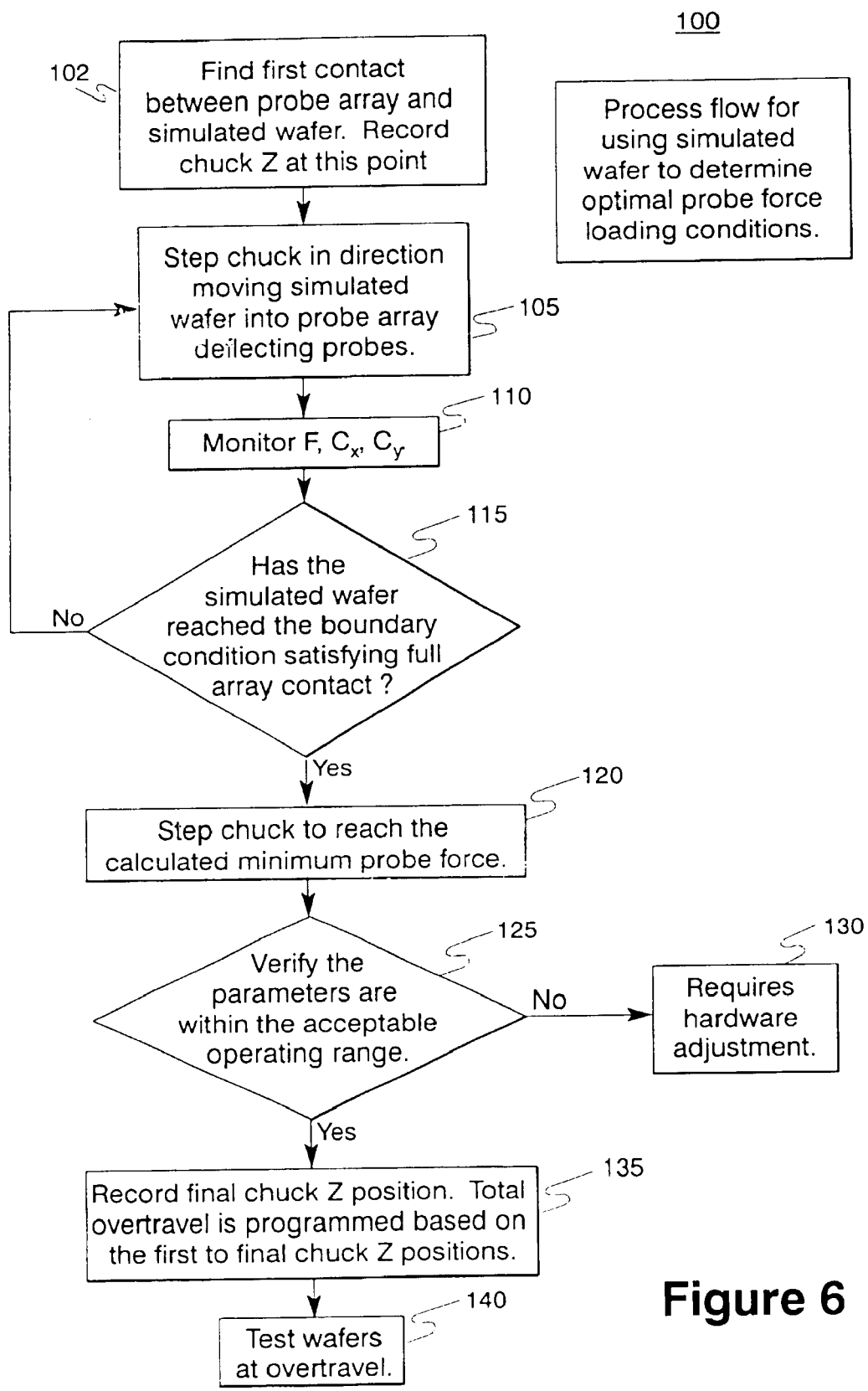
FIG. 6 illustrates a flow diagram of the process employing a simulated wafer to determine optimal probe force loading conditions.

FIG. 6 illustrates a flow diagram of the process 100 employing a simulated wafer to determine optimal probe force loading conditions. As shown in FIG. 6, a first step 102 includes finding a first contact between the probe array and simulated wafer and recording the chuck Z position at this point. Then, at step 105, the chuck is stepped in the direction for moving the simulated wafer into the probe array deflecting probes. At the stepped position, the force exerted on the probe (F), and the locations of the X-centroid $C_x$, and the Y-centroid $C_y$ is monitored, as indicated at step 110. Then, at step 115, a determination is made as to whether the simulated wafer reached the boundary condition satisfying full array contact. If the simulated wafer did not reach the boundary condition, the process returns to step 105 to further step the position of the chuck and these process steps continue until the simulated wafer reached the boundary condition satisfying full array contact at step 115. At such time, the process proceeds to step 120 where the chuck is stepped to reach the calculated minimum probe force. Then, at step 125, a verification is made as to whether the parameters are within the acceptable operating range. If the parameters are not in the acceptable operating range, then a hardware adjustment is required which may be performed at step 130. Otherwise, if at step 125 it is determined that the parameters are within the acceptable operating range, then at step 135, the final chuck Z position is recorded and the total optimum overtravel is determined based on the first to final chuck Z positions. Finally, at step 140, the DUT (s) on the product wafer are tested at the optimum overtravel.

Thus for a given array the desired minimum probe force that is experienced by the probe with the least deflection can be determined from the total force (F) and location of the centroid ($C_x$ and $C_y$). For the example of a uniform array the minimum probe force ($F_m$) can be determined by $F_m = [F^*(6^*C_x + 6^*C_y - 5)]/N$ where N is the total number of probes. For $C_x$ and $C_y$, the centers of force are defined by location of the respective center of force divided by the overall respective X or Y dimension of the array. The $C_x$ and $C_y$ variables are therefore dimensionless fractions taken from the side of the DUT that experiences the greatest force wherein:

$$C_x = \frac{0.5Z + \frac{W}{6}\tan\Theta + \frac{L}{4}\tan\Phi}{Z + \frac{W}{2}\tan\Theta + \frac{L}{2}\tan\Phi},$$

the location of the x-component of the center of force on the DUT, and, $$C_y = \frac{0.5Z + \frac{L}{6}\tan\Phi + \frac{W}{4}\tan\Theta}{Z + \frac{W}{2}\tan\Theta + \frac{L}{2}\tan\Phi},$$

the location of the y-component of the center of force on the DUT, where W is the width of the DUT that is in contact with the probe system and, and L is the length of the DUT that is in contact with the probe system. The angles between the planes can be calculated from $\Theta = \mathrm{atan}[(6^*F - 12^*F^*C_x)/k^*N^*W]$ where k is the spring rate per probe (probe stiffness), $\Theta$ is the angle about the Y axis to the X axis, W is the width of the array in the X direction, and $\Phi = \mathrm{atan}[(6^*F - 12^*F^*C_y)/k^*N^*L]$ where $\Phi$ is the angle about the X axis to the Y axis and L is the length of the array in the Y direction. The angles can be used in step 125 (FIG. 6). These equations are found to be valid even if the chuck and DIB are deflecting non linearly during probing. In non uniform arrays the location of A can be determined with numerical methods, in this case the area is not necessarily square.

Figure 5:
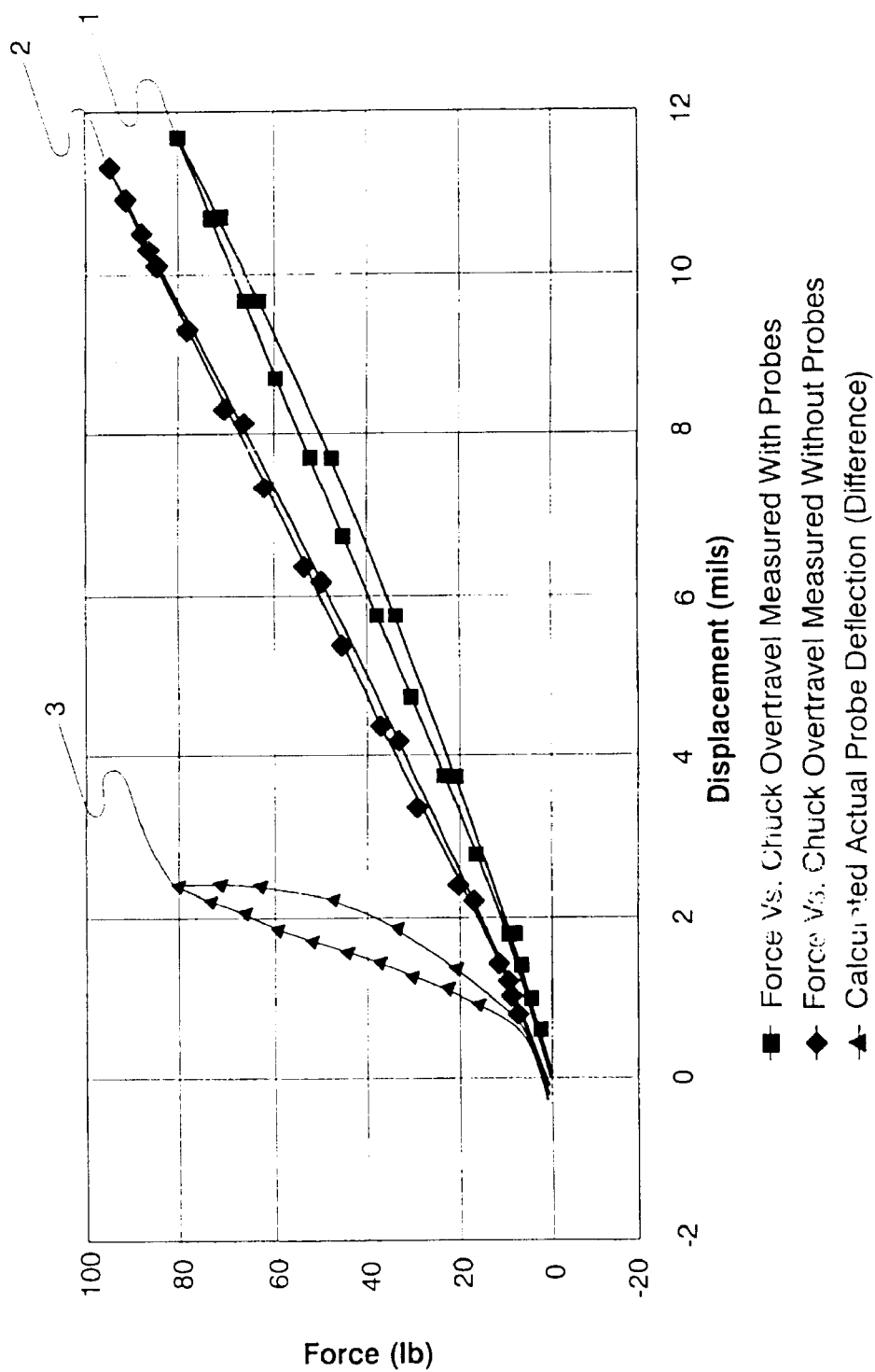
FIG. 5 illustrates a graphical representation of measured load force versus chuck position.

With regard to FIG. 5 this illustrates the measured load force versus chuck position for programmed chuck heights measured with probes (1). Thus if the optimum total force is 60 lb, then overtravel would be set to 9 mils. FIG. 5 also demonstrates the use of the simulated wafer to measure the probe compliance. The probes are removed and replaced with a rigid block which is brought into contact with the simulated wafer. The measured deflection (2) is now due to the chuck, DIB, head plate etc. Subtracting data 2 from data 1 results in the actual probe deflection as a function of force. The probe force is higher as the chuck steps upward then when it is stepped back down. This is the hysteresis that is expected with buckling beam probes and is due to friction between the probes and probe guides.

Thus, the graphical representations represent typical test data derived from the use of the simulated wafer test system verifying the simple and advantageous construction and functioning thereof.

The foregoing construction is extremely simple in nature and facilitates an accurate simulation of forces which are imparted to a typical wafer structure by means of the simulated wafer test systems.

It will be clear to one skilled in the art that under some circumstances it will be advantageous to permanently mount one or more simulated wafers on the side of the wafer chuck or some other part of the test equipment. This has the advantage that the wiring and calculations can be integrated into the function of the prober system. The simulated wafer may have a plurality of test areas at various locations to investigate chuck deflection or to work over different force ranges. The invention has been described for testing DUTs in wafer form but is equally useful for testing known good die and the contactors and sockets used for module test of the packaged DUTs.

While there has been shown or described what are considered to be a preferred embodiment of the present invention, it will, of course, be understood that various modifications and changes in form or detail could readily be made without departing from the spirit of the invention. It is, therefore, intended that the invention be not limited to the exact form and detail herein shown and described, nor to anything less than the whole invention herein disclosed as hereinafter claimed.

What we claim is:

1. A test system for testing devices under test (DUTs) located on a product wafer, said test system comprising:

a support plate having a surface with a simulated wafer being arranged thereon, said simulated wafer including a load plate and a plurality of load cells retained in a spaced array interposed between said load plate and said support plate surface;

a wafer probe arrangement including a device interface board mounting a plurality of probes being arrayed in opposed relationship to said load cells facing towards said load plate; and movable structure for imparting movement to said support plate for biasing said simulated wafer into contact with said plurality of probes to determine an optimum overdrive for a specific product which results in optimized probe force, said movable structure implementing said optimum overdrive during testing of said DUTs on said product wafer, whereby said probe force for each said probe of the plurality of probes responsive to pressure exerted between said respective load cells and probes is indicative of the plurality of the wafer surface at the final overdrive position for said load support plate.

2. A test system as claimed in claim 1, further comprising means for measuring differences in planarity between said simulated wafer and said probes.

3. A test system as claimed in claim 2, wherein said measuring means accounts for planarity differences by monitoring a location of an X-component of the force on the DUT and a location of an Y-component of the force on the DUT, wherein a limit for overdriving said simulated wafer is a function of said measured probe force on said DUT and said X- and Y-components thereof.

4. A test system as claimed in claim 2, wherein said overdrive is determined by a difference between an initial position of said simulated wafer when biased to make initial contact with said probe array, and a final position of said simulated wafer when biased to contact at least probe array such that each said probe is minimally deflected.

5. A test system as claimed in claim 1, wherein said movable structure comprises a chuck for displacing said simulated wafer into a Z-direction towards and away from said wafer probe arrangement, said chuck further supporting the DUT wafer structure during said DUT testing.

6. A test system as claimed in claim 1, wherein a retainer frame extends about the periphery of said load plate for maintaining said load plate on said support plate.

7. A test system as claimed in claim 1, wherein said simulated wafer is mounted to the side of a chuck or integrated into a scrub block, said chuck further supporting the DUT wafer structure during said DUT testing.

8. A test system as claimed in claim 1, wherein each of said plurality of load cells comprise a strain gauge.

9. A test system as claimed in claim 1, wherein measurements indicative of planarity are determined from the magnitude of the individual loads at each of said load cells.

10. A test system as claimed in claim 1, wherein said plurality of load cells comprises three load cells at known locations relative to said probe array.

11. A test system as claimed in claim 1, wherein different simulated wafer structures are optimized for selectively high or low probe forces or for probes of high or low compliance in dependence upon specific physical applications.

12. A method of testing devices under test (DUTs) located on a product wafer, said method comprising:

providing a support plate with a surface with a simulated wafer being arranged thereon, said simulated wafer including a load plate and a plurality of load cells retained in a spaced array interposed between said load plate and said support plate surface;

providing a wafer probe arrangement including a device interface board mounting a plurality of probes being arrayed in opposed relationship to said load cells facing towards said load plate;

causing a movable structure to impart movement to said support plate for biasing said simulated wafer into contact with said at least probe, and determining the optimum overdrive for a specific product which results in optimized probe force; and implementing said optimum overdrive during testing of said DUTs on said product wafer, whereby said probe force for each said probe of the plurality of probes responsive to pressure exerted between said respective load cells and probes is indicative of the plurality of the wafer surface at the final overdrive position for said support plate.

13. A method as claimed in claim 12, further comprising the steps of:

measuring an amount of force on a device under test (DUT) when biased for contact with said plurality of probes; and, measuring differences in planarity between said simulated wafer and said plurality of probes.

14. A method as claimed in claim 13, wherein said measuring differences in planarity includes: monitoring a location of an X-component of the force on the DUT and a location of an Y-component of the force on the DUT, said method including determining a limit for overdriving said simulated wafer as a function of said measured probe force on said DUT and said X-and Y-components thereof.

15. A method as claimed in claim 14, wherein said overdrive is determined by recording a difference between an initial position of said simulated wafer when biased to make initial contact with said plurality of probes, and a final position of said simulated wafer when biased to contact said plurality of probes such that said probes are minimally deflected.

16. A method as claimed in claim 12, wherein said movable structure comprises a chuck for displacing said simulated wafer into a Z-direction towards and away from said wafer probe arrangement, said chuck further supporting the DUT wafer structure during said DUT testing.

17. A method as claimed in claim 12, wherein different simulated wafer structures are optimized for selectively high or low probe forces or probe systems with high or low compliance in dependence upon specific physical applications.

* * * * *